United States Patent [19]

Solomon et al.

[11] Patent Number: 4,907,128
[45] Date of Patent: Mar. 6, 1990

[54] CHIP TO MULTILEVEL CIRCUIT BOARD BONDING

[75] Inventors: Allen L. Solomon, Fullerton; Sus Mayemura, Laguna Hills; Frank Piersanti, Orange, all of Calif.

[73] Assignee: Grumman Aerospace Corporation, Bethpage, N.Y.

[21] Appl. No.: 284,929

[22] Filed: Dec. 15, 1988

[51] Int. Cl.$^4$ ............................................. H05K 1/18
[52] U.S. Cl. .................................................. 361/412
[58] Field of Search ............... 361/412, 413, 414, 415, 361/393, 395, 396, 401

[56] References Cited

U.S. PATENT DOCUMENTS

| | | | |
|---|---|---|---|
| 3,582,714 | 6/1971 | Shmurak et al. | |
| 3,970,990 | 7/1976 | Carson | 340/146 |
| 4,288,841 | 9/1981 | Gogal | 361/401 |
| 4,304,624 | 12/1981 | Carson et al. | 156/630 |
| 4,342,069 | 7/1982 | Link | 361/395 |
| 4,352,715 | 10/1982 | Carson et al. | 156/634 |
| 4,354,107 | 10/1982 | Carson et al. | 250/239 |
| 4,638,348 | 1/1987 | Brown et al. | 361/412 |
| 4,705,917 | 11/1987 | Gates et al. | 361/401 |

Primary Examiner—Roy N. Envall, Jr.
Attorney, Agent, or Firm—Stetina and Brunda

[57] ABSTRACT

A process for bonding electrical terminals of an integrated circuit chip to conductive regions of a multilayered circuit board is disclosed, along with the resulting multilayer module. The process comprises forming a plurality of circuit board layers and stacking them to define a well area therein. The well area having a base defined by one of the circuit board layers and sidewalls defined by vertical edge portions of a plurality of the remaining circuit board layers, the conductive patterns having conductive termination regions formed adjacent to the vertical edge portions. Conductive vertical vias are formed along vertical edge portions of a plurality of circuit board layers in electrical communication with the conductive termination regions. Flexible conductive strips are applied to the integrated circuit in electrical communication with the integrated circuit terminals. The conductive strips extend beyond the integrated circuit extend along the conductive vias, and be in electrical communication therewith, as the integrated circuit is disposed within the well area. Board lead connections to integrated circuit terminals are selected by patterning the board leads to contact specific conductive termination regions.

11 Claims, 3 Drawing Sheets

CHIP TO MULTILEVEL CIRCUIT BOARD BONDING

BACKGROUND OF THE INVENTION

The present invention relates to the structure and process for bonding an integrated circuit chip to a multilevel circuit board without the need for prior art bonds.

Integrated circuits are commonly mounted on circuit boards and connected to conductive patterns formed on the circuit boards. The most common means of connecting the integrated circuits to the conductive patterns is by the use of numerous wire bonds. Each wire is bonded to both a terminal, usually a metal pad, of the integrated circuit and to a connecting pad in the conductive pattern of the circuit board.

Though wire bonding techniques are suitable for many applications, such techniques present difficulties where the module is small and the available area for connecting pads is limited. The process of reliably connecting wire bonds to small pads is both very tedious and expensive. Both ends of the wire bond must be accurately placed to avoid contacting adjacent pads. Moreover, the wire must be sufficiently welded to the conductive pads to insure a firm connection, without damaging the substrate or any underlying structure.

Where circuit board layers are stacked with various layers being connectable to the integrated circuit onto a multiplicity of integrated circuits, the board pads, which are used for integrated circuit connection, are located at different board levels. Thus, the board production technique becomes more complex, requiring different layers to be formed to different configurations and within close tolerances. A further difficulty may arise with respect to height requirements imposed by arching of the wire bonds from the surface of the upper most circuit board layer. Where the stack or modules are to be stacked, one atop the other, the characteristic arching of the wire bonds limits the ability to achieve close vertical spacing of adjacent modules. Further, it is desired to reduce the area of the board contacts to consume significantly less space than is consumed by bonding pads.

Accordingly, there is a need for an alternative technique for connecting integrated circuits to a multiboard or multilayer stack or module whereby the various difficulties associated with wire bonding may be overcome. The present invention provides such a technique which elimates the use of wire bonds, thereby avoiding the need for bonding tools and the penalties associated with raised bridging wires. The present invention also reduces the complexity of the board profile and increases the available area for the integrated circuit or the conductive patterns formed on the circuit boards.

SUMMARY OF THE INVENTION

A process for bonding electrical terminals of an integrated circuit chip or a multiplicity of integrated circuit chips to conductive regions of a multilayered circuit board is disclosed, as well as the resulting multilayer module configuration. The process comprises forming a plurality of circuit board layers and stacking them to define a well region therein. The well has a base defined by one of the circuit board layers and sidewalls defined by vertical edge portions of a plurality of the remaining circuit board layers. Conductive patterns are formed on the layers, having conductive termination regions formed adjacent at least one of the vertical edge portions. Conductive vertical vias are formed along vertical edge portions of a plurality of circuit board layers in electrical communication with the conductive termination regions. Flexible conductive strips are applied to the integrated circuit, in electrical communication with the integrated circuit terminals. The conductive strips extend beyond the integrated circuit and along the conductive vias. The conductive strips effect electrical communication between the chip terminals and the vias as the integrated circuit is disposed within the well.

The conductive vias may be formed by metalizing hollows formed in the vertical edge portions of each of a plurality of layers and extendable along substantially the entire height of the module. In the presently preferred embodiment each layer is provided with a conductive termination region adjacent to each conductive via. However, it is understood that the conductive termination regions are formed on the layers primarily to support conductive patterns to be connected to the vias.

Connection to an integrated circuit is made where a layer conductive lead pattern includes or is in a path with a layer conductive termination. Thus, layer conductive patterns are selectively in electrical communication with a particular integrated circuit terminal. Alternatively, the conductive vias may be gang connected to conductive pattern portions on a plurality of layers, where common signal communication requirements exist on multiple layers.

BRIEF DESCRIPTION OF THE DRAWINGS

FIG. 3b is a side view illustrating the use of contemporary wire bonding techniques to connect an integrated circuit to the layer level shown at FIG. 3a;

DETAILED DESCRIPTION OF THE PRESENTLY PREFERRED EMBODIMENT

The detailed description set forth below is intended merely as a description of the presently preferred embodiment of the invention, and is not intended to represent the only form in which the invention may be constructed or utilized. The description below sets forth the functions and sequence of construction steps utilized to implement the invention in connection with the illustrated embodiment. It is to be understood, however, that the same, or equivalent structure or construction steps may be used to implement different embodiments that are also intended to be encompassed within the spirit and scope of the invention.

Figure 1:
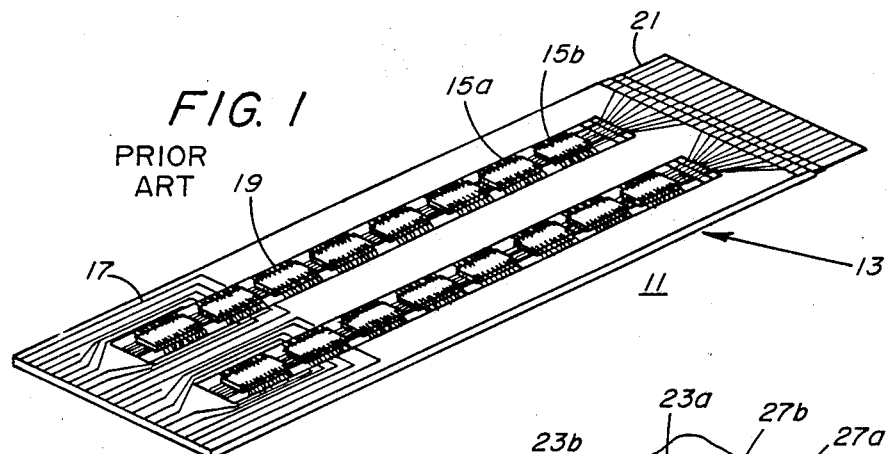
FIG. 1 is a perspective view of a multilayer module in which the present invention finds exemplary application.

Referring to FIG. 1 wherein there is shown a typical multilayered module 11 formed in accordance with contemporary techniques. The module 11 may be one of many stacked vertically and horizontally to form an assembly. Input signals may be communicated from the left most portion of the module 11 along conductive paths 17, which are connected by a series of wire bonds, such as 15a and 15b, to the integrated circuits 19. Outputs from the integrated circuits may be communicated, again by means of wire bonds, to conductive patterns 21 formed on the layers, usually the bottom or the lowest layer, and thereafter communicated to external circuitry.

Reference is made to the following patents, which are representative of the present state of the art in relation to the construction of such modules:

U.S. Pat. No. 3,582,714 to Carson, et al.;
U.S. Pat. No. 3,970,990 to Carson, et al.;
U.S. Pat. No. 4,304,624 to Carson, et al.;
U.S. Pat. No. 4,352,715 to Carson, et al.; and
U.S. Pat. No. 4,354,107 to Carson, et al.

Figure 2:
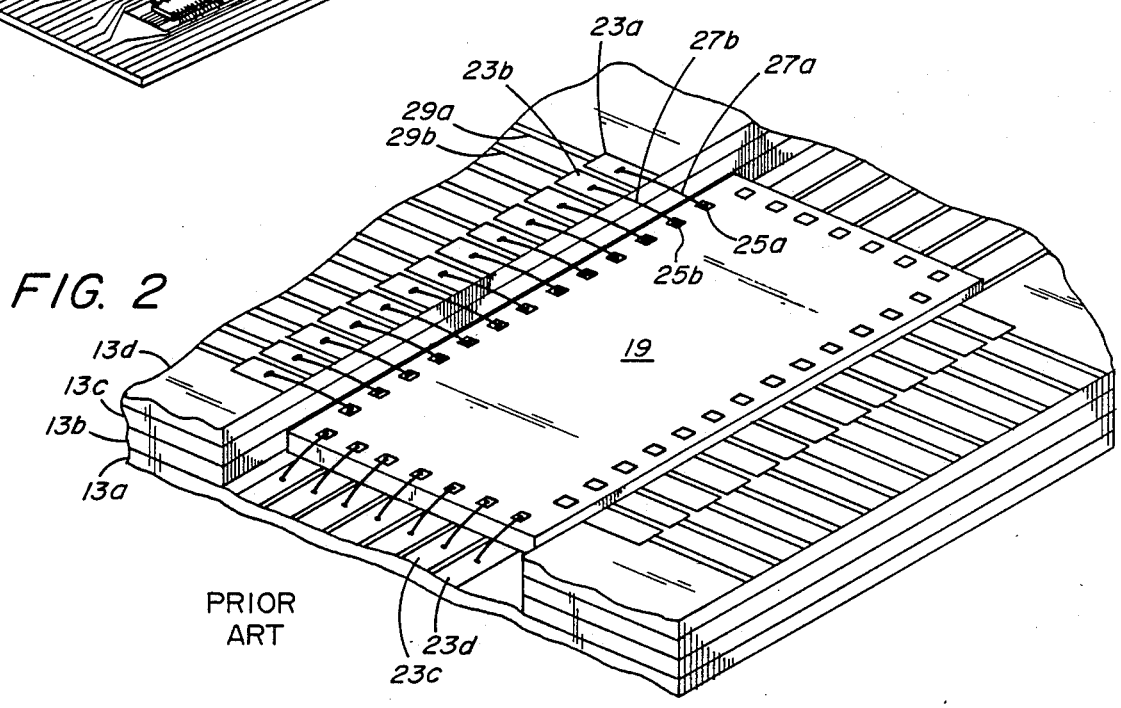
FIG. 2 is an enlarged view of an integrated circuit shown connected to a multilayer circuit board using prior art bonding techniques.

Such prior art modules may typically be four layers thick and support 16 integrated circuits, disposed in wells formed in the circuit boards. FIG. 2 provides further illustration of an integrated circuit 19 disposed in a well formed within module 11, illustrating the means by which the integrated circuit is typically connected to conductive patterns formed on the module layers.

As shown at FIG. 2, the integrated circuit rests atop layer 13a, which may typically be to the lowest layer of module 11. The layers 13b, 13c, and 13d are formed or profiled to have cutout regions, which are sized in such a way that when the layers are subsequently stacked, these regions form wells to receive one or a linear array of integrated circuit chips 19. Conductive pads, such as pads 23a and 23b may be formed on the module levels. Pads, such as 25a and 25b are formed on the upper horizontal surface of integrated circuit 19. Wire bonds, such as wire bonds 27a and 27b extend between the pads formed on the surface of the integrated circuit (25a, 25b) and the pads formed on the circuit board (23a, 23b). The pads 23a, 23b formed on the surface of the module layer 13d, are each connected to portions 29a and 29b of a conductive pattern formed on the upper horizontal surface of a module layer. Similarly, the conductive patterns 23c and 23d on layer 23a can serve as output and chip operating connections.

Figure 3A:
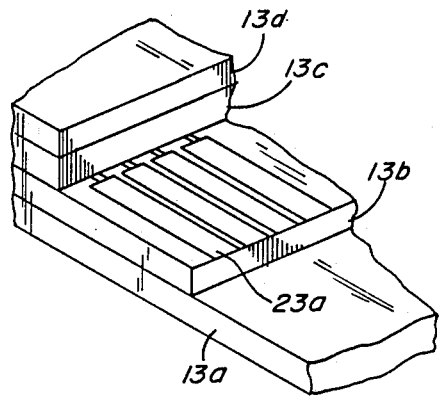
FIG. 3a is a perspective view of a portion of a multilayered circuit board illustrating the difference in sizes of adjacent layers.
Figure 3B:
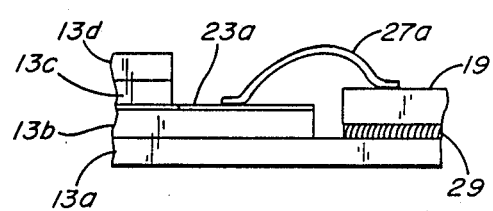
Figure 3C:
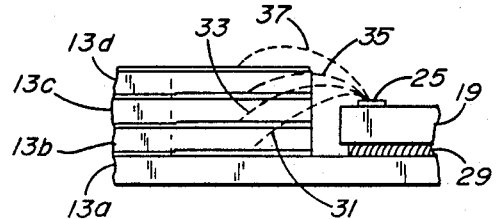
FIG. 3c is a side view illustrating the use of contemporary wire bonding techniques to connect an integrated circuit to each of a plurality of layers of a multilayered circuit board.

FIGS. 3a, 3b and 3c further illustrate contemporary bonding techniques used to implement the structure illustrated at FIGS. 1 and 2. Referring to FIG. 3a, that figure illustrates the multiple level construction of the various layers to permit the wire bonds to be connected to the individual layers. It should be apparent that if the well edge profile of a layer were straight, there would be no direct exposure of the conductive patterns formed on the underlying layers and therefore there could be no direct connection of all the wire bonds to a layer. Thus, prior to the present invention, the method of connecting the integrated circuit to the conductive paths has been by means of individual welded wire or strip bonds connected to conductive pads exposed on different levels of the module layers. In a module such as that illustrated at FIG. 1, the contemporary technique requires the welding of over thirteen hundred bonds in the formation of each four layer module. The expense and reliability difficulties of such a construction should be apparent to those of ordinary skill in the art.

FIG. 3a is a perspective view of a set of exposed bonding pads on a layer 13b level which overlaps a corresponding set of pads on layer 13a. FIG. 3b is a cross sectional view that illustrates the manner in which a wire bond is used to connect a contact pad on the integrated circuit 19 to a layer bonding pad. Wire bond 27a extends from a point on the surface of integrated circuit 19 to connect to conductive pad 23a formed on the upper surface of layer 13b. As shown at FIG. 3b, the wire bond 27a exhibits a raised, or arched shape which may extend above the upper surface of layer 13d. As also shown in FIG. 3b, integrated circuit 19 may be secured to the upper surface of base layer 13a by means of a suitable electrically insulating adhesive layer 29.

FIG. 3c is a side view illustrating the manner in which wire bonds may be connected to conductive patterns formed on the surface of layers 13a–13d. As shown at FIG. 3c wire bonds 31, 33, 35 and 37 connect the integrated circuit 19 to conductive patterns formed on the surface of layers 13a, 13b, 13c and 13d, respectively. It is to be understood that all connectors of an individual integrated circuit may be connected to conductive pads formed on the surface of a single layer. FIG. 3c is intended as a generalized representation of the manner in which one or more integrated circuits may be connected to the various layers. The figure further illustrates the arched or raised profile of the wire bonds, which may add to the overall height of the module and limit the ability to stack closely adjacent modules.

Figure 4:
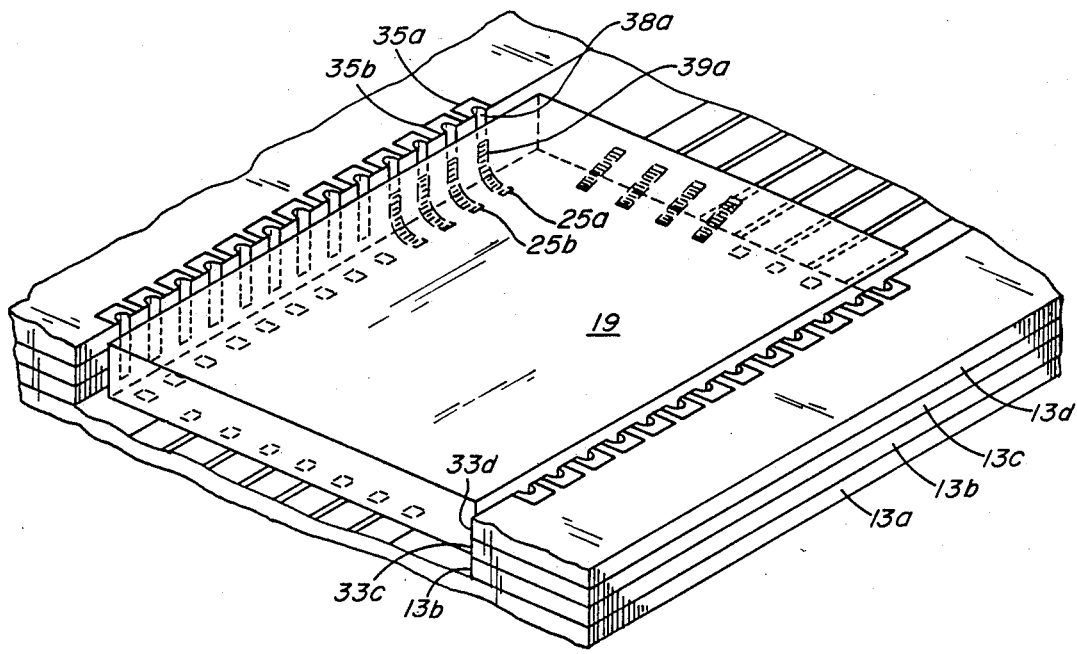
FIG. 4 is a perspective view of the technique of connecting an integrated circuit to a multilayer circuit board module, in accordance with the present invention.

FIG. 4 illustrates a construction in accordance with the present invention. As shown at FIG. 4, integrated circuit 19 is inverted and disposed in a well defined by vertical edge surfaces, 33b, 33c, 33d, of the layers 13b, 13c and 13d, respectively. In accordance with the present invention, the use of wire bonds is eliminated and replaced by the use of flexible conductive strips such as 39a extending from the integrated circuit terminal 25a to conductive vertical vias, such as 38a. These vias provide an abutting electrical connection to the flexible conductive strips.

Each vertical via is typically in contact with a conductive film pad such as 35a, 35b on each layer. Certain sets of these pads are part of a conductive film pattern that includes circuit board leads such as 17 or 29a. Thus, a connection is made from an integrated circuit chip pad to a specific lead on a specific layer. In accordance with the present invention, the flexible vertical strips can be welded to integrated circuit chip pads by the conventional inner bond, tape automated bonding technique prior to disposing the chip within a well formed in module 11. The strips are sized to extend beyond the vertical edge portion of the integrated circuit such that as the integrated circuit is disposed within the well, the flexible conductive strips are flexed upwardly along the length of the conductive vertical vias. Thus, the integrated circuit may be connected to the conductive pads without the need for wire bonding techniques or for large area bonding pads on a layer.

Figure 5A:
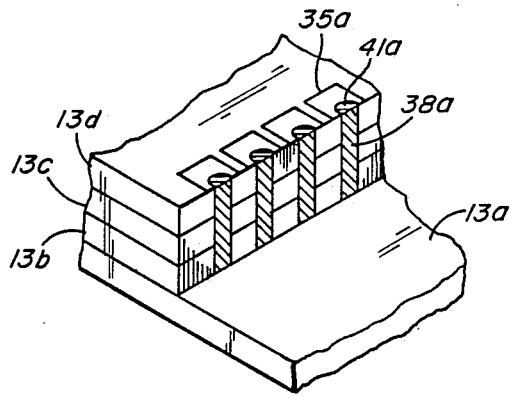
FIG. 5a is an enlarged perspective view of edge portions of the multilayer circuit board module shown at FIG. 4.

FIG. 5a illustrates a vertical edge portion of the layers formed in accordance with the present invention. As shown in FIG. 5a the conductive vias, such as 38a, are formed in metalized hollows or grooves, such as 41a, extending vertically along the length of the stacked layers 13b, 13c and 13d. Metalizing may be effected such that the conductive vias are substantially flush with the vertical edge surfaces of the stacked layers.

Figure 5B:
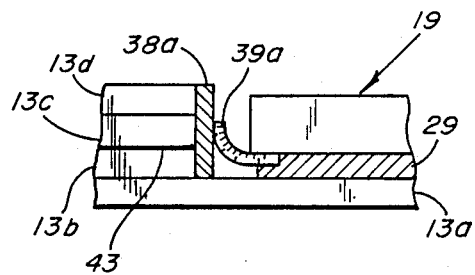
FIG. 5b is a cross sectional side view showing the flexible conductive strips connecting the integrated circuit and the multilayer module.

FIG. 5b is a cross sectional view of an inverted integrated circuit chip bonded in a well, in accordance with the present invention. It illustrates the manner in which the via 38a and flexible conductive strip 39a facilitate electrical connection between the integrated circuit of chip 19 and a conductive region 43 formed on the upper surface of layer 13b. The integrated circuit chip 19 is held in place on layer 13a by an electrically insulating adhesive layer 29.

As can be seen from FIG. 5b, the via 38a connects an integrated circuit terminal to a board lead only where leads are connected to conductive regions on a layer. The invention therefore permits the formation of conductive vias in the same manner regardless of which circuit board layer the integrated circuit is to be connected. If the particular integrated circuit terminal is not to be connected to a given layer, the conductive via is simply not connected to any portion of the conductive path formed on that layer. It is further to be understood that in certain instances it may be desirable to connect a particular integrated circuit terminal to a plurality of layers. The present invention permits this flexibility by the use of a vertical via connectable to conductive patterns formed on any of a plurality of layers.

Figure 6A:
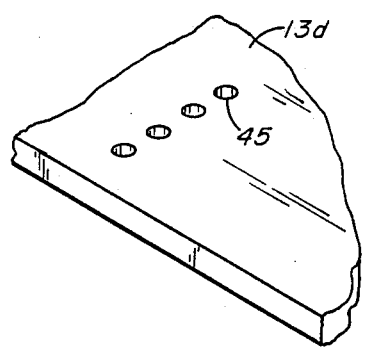
FIG. 6a-e are perspective views illustrating an exemplary manner of forming the edge portions of the multilayer module in accordance with the present invention.

FIGS. 6a–6e demonstrate a typical technique for forming a module in accordance with the present invention. As shown at FIG. 6a, a plurality of apertures 45 may be drilled in individual layers, such as 13d. The apertures define the location of the conductive termination regions and the vertical vias, as described below.

Figure 6B:
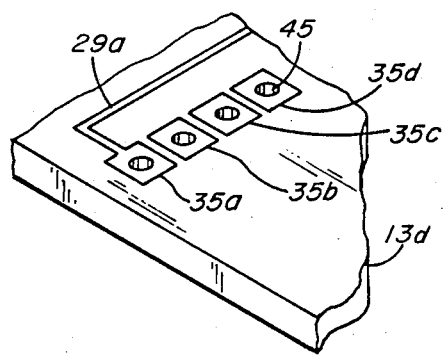

FIG. 6b illustrates the formation of conductive termination regions 35a, 35b, 35c, 35d about each of the apertures 45. Conductive metal patterns formed on the upper surface of a layer, such as 13d, may be connected to one or more of the conductive regions 35a–35d. As shown at FIG. 6b, conductive lead pattern portion 29a is connected to conductive region 35a. The remaining conductive regions 35b, 35c and 35d are not connected to the conductive pattern formed on the upper surface of layer 13d. Metal is also deposited on the walls of apertures 45.

Figure 6D:
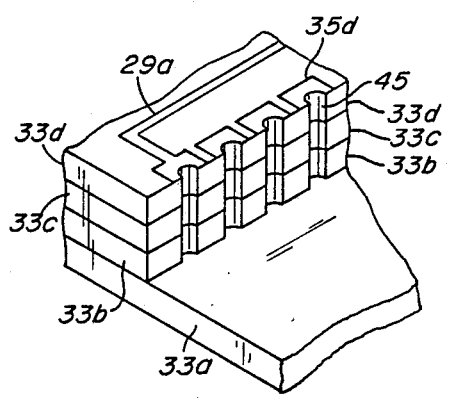
Figure 6C:
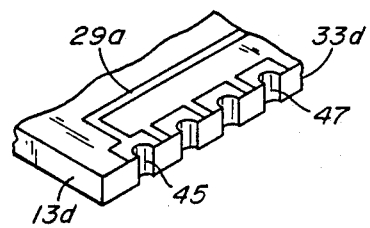
Figure 6E:
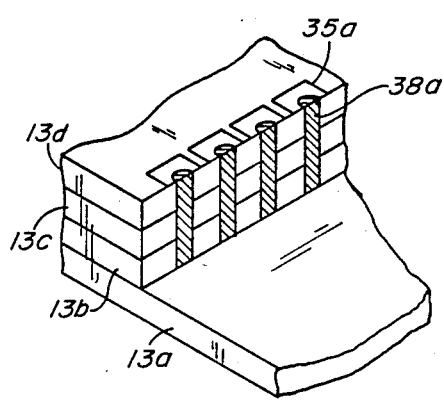

As shown at FIG. 6c and 6d each of the layers may be profiled to form a well when the layers are stacked on base layer 13a. The layers 13b, 13c and 13d are cut such that the vertical edge portions 33d, 33c, 33b extend through the conductive regions 35a–35d and the apertures 45. As shown at FIG. 6e the hollows or grooves formed by cutting through the apertures 45 are further metalized to form vertical vias, such as 38a, extending along the vertical height of the module. The vias can be formed by solder filling the hollows 47 such that the vias extend substantially flush with the vertical edge surface of the layers 13b, 13c, and 13d.

Figure 7:
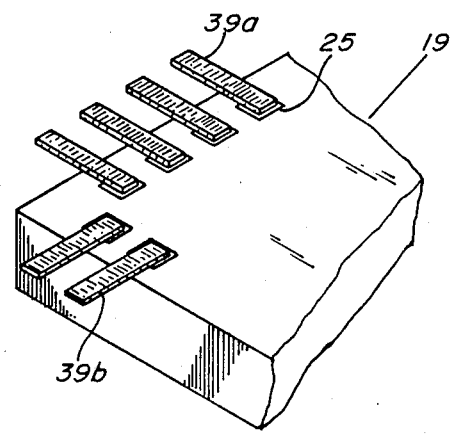
FIG. 7 is a perspective view illustrating the application of the flexible conductive strips to the integrated circuit chip.

FIG. 7 illustrates the connection of the flexible strips such as 39a to integrated circuit pads on chip 19. As shown in FIG. 7 a plurality of conductive strips may be secured to the integrated circuit prior to placing the integrated circuit within the well. As the integrated circuit is disposed in its location, the conductive strips 39a make contact with the vias, such as 38a, as illustrated at FIGS. 4 and 5b. Strips such as 39b, which are located perpendicular to strips such as 39a, can be conventionally tape or bump bonded to a pattern of conductors on layer 13a, as illustrated in FIG. 4. Since such connections can be made common to all chips in a well, they can be conveniently used for chip operation.

It is to be understood that the construction techniques used to form the invention may be varied in sequence or modified in various ways to suit particular applications without departing from the broader aspects of the invention. The particular structure and sequence of the construction steps set forth above are therefore intended to be illustrative of but a single emobodiment of the invention.

What is claimed is:

1. A process bonding electrical terminals of integrated circuit chips to conductive regions on a multi-layered circuit board comprising:
   forming circuit board layers and stacking the layers to define a well region therein, said well having a base defined by one of the circuit board layers and side walls defined by vertical edge portions of a plurality of the remaining circuit board layers;
   forming conductive patterns on a plurality of the circuit board layers, said conductive patterns having conductive termination regions adjacent at a vertical edge portion defining the well side walls;
   forming conductive patterns on a circuit board layer where the circuit portion of the pattern is connected to a conductive termination region only where communication is to be established with a terminal of an integrated circuit;
   forming conductive vertical vias along the vertical edge portions of a plurality of the circuit board layers said vias being in electrical communication with said termination regions;
   applying flexible conductive strips to the integrated circuit in electrical communication with the integrated circuit terminals, said conductive strips being extendable from the integrated circuit to contact the conductive vias when the integrated circuit is disposed within the well area.

2. The process as recited in claim 1 wherein the integrated circuit is disposed within the well such that the flexible conductive strips extend the base of the well area from the integrated circuit to abutting electrical contact with the conductive vias formed on the vertical edge portions of the circuit board layers.

3. The process for bonding an integrated circuit chip to a multi-level circuit board comprising:
   forming conductive patterns along a horizontal surface of a plurality of circuit boards said conductive patterns having conductive termination regions disposed along vertical edge portions of the circuit boards for communicating signals to and from the circuit board conductive patterns;
   stacking the circuit boards such that the termination regions are in substantial vertical alignment;
   connecting the aligned conductive termination regions by conductive vertical vias, said vias extending along vertical edge portions of the well defined by stacked circuit boards;

connecting a plurality of conductive strips to terminals of an integrated circuit;

disposing the integrated circuit adjacent the stacked circuit boards such that the conductive strips effect electrical communication between the integrated circuit and the conductive patterns formed on the circuit boards.

4. The process as recited in claim 3 wherein each of the conductive strips is in electrical communication with a dedicated conductive vias.

5. The process as recited in claim 3 further comprising the step of mounting the aligned circuit boards on a base and supporting the integrated circuit on an upper surface of the base.

6. The process as recited in claim 5 wherein the vertical edge portions are formed to define a side walls of a well within which the integrated circuit may be disposed.

7. A process for bonding an integrated circuit to conductive patterns formed on a multilevel circuit board comprising:

drilling a plurality of apertures in each of a plurality of circuit boards;

forming conductive termination regions about each of the apertures and a conductive coating on the aperture walls; connecting the termination regions to a circuit pattern formed on at least one surface of each of the circuit boards;

cutting each of the circuit boards such that the conductive termination regions are disposed adjacent vertical edge portions of the circuit boards;

stacking the layers such that the conductive termination regions are in substantial vertical alignment; forming a conductive path connecting the termination regions formed on the aligned edge portions, said conductive path being exposed along the aligned vertical edge portions of the circuit boards;

connecting flexible conductive strips to terminals of the integrated circuit, each of said strips being connected to a dedicated terminal;

disposing the integrated circuit adjacent to the aligned vertical edge portions such that the flexible conductive strips extend to abutting electrical connection with the conductive vertical paths to effect electrical communication between the integrated circuit terminals and the conductive patterns formed on the circuit boards.

8. A multilayer integrated circuit module comprising:

a first circuit board layer forming a module base;

a plurality of second circuit board layer stacked upon said base, each of said second board layers having an electrical conductive pattern formed on a horizontal surface thereof, each of said second circuit board layers being formed to have a cut-out region which, upon stacking of said second circuit board layers collectively form a well above the base;

each of said conductive patterns formed on said second circuit board layers includes a conductive termination region exposed to the cut-out region;

an integrated circuit having a plurality of terminals mounted on the module base;

a plurality of conductive vertical vias formed along edge portions of the plurality of second layers, said conductive vias being in electrical communication with the terminal regions formed on a plurality of said second circuit board layers;

a plurality of flexible conductive strips secured to the integrated circuit terminals and extending from the integrated circuit into abutting electrical connection with the conductive vertical vias.

9. The module as recited in claim 1 wherein the flexible conductive strips are adhered to the integrated circuit terminals and held in place between the integrated circuit and the module base.

10. The module as recited in claim 8 wherein the flexible conductive strips extend horizontally along the module base beyond the integrated circuit and curve upwardly along the length of the conductive vertical vias.

11. The module as recited in claim 8 wherein hollows are formed in each of the second circuit board layers to receive the conductive vertical vias, such that the bias are substantially flush with vertical edge portions of the second circuit board layers.

* * * * *

UNITED STATES PATENT AND TRADEMARK OFFICE
CERTIFICATE OF CORRECTION

PATENT NO. : 4,907,128
DATED : March 6, 1990
INVENTOR(S) : Solomon et al.

It is certified that error appears in the above-indentified patent and that said Letters Patent is hereby corrected as shown below:

Column 3, line 62, delete "23a" and insert therefor --13a--.

Column 6, line 53, after "extend" insert --adjacent--.

Column 7, line 12, delete "vias", and insert therefor --via--.

Column 7, line 28, after ";" begin new paragraph with --connecting--.

Column 7, line 36, after ";" begin new paragraph with --forming--.

Column 8, line 8, delete "layer" and insert therefor --layers--.

Column 8, line 24, delete "terminal" and insert therefor --termination--.

Column 8, line 41, delete "bias" and insert therefor --vias--.

Signed and Sealed this

Fourth Day of January, 1994

*Attest:*

*Attesting Officer*

BRUCE LEHMAN

*Commissioner of Patents and Trademarks*